United States Patent [19]

Kanda et al.

[11] Patent Number: 5,308,735

[45] Date of Patent: May 3, 1994

[54] PHOTOSENSITIVE DIAZO RESINS AND RESIN COMPOSITIONS FOR LITHOGRAPHIC PRINTING HAVING A QUATERNARY AMMONIUM SALT-CONTAINING GROUP

[75] Inventors: Kazunori Kanda, Yao; Edward Lam, Hirakata; Osamu Nanba, Takarazuka, all of Japan

[73] Assignee: Nippon Paint Co., Ltd., Osaka, Japan

[21] Appl. No.: 968,310

[22] Filed: Oct. 29, 1992

[30] Foreign Application Priority Data

Nov. 1, 1991 [JP] Japan .................. 3-287492

[51] Int. Cl.⁵ .......................... G03F 7/021
[52] U.S. Cl. .................. 430/175; 430/176; 534/561; 534/563
[58] Field of Search ........... 430/175, 176; 534/558, 534/565

[56] References Cited

U.S. PATENT DOCUMENTS 4,220,700  9/1980  McGuckin et al. .............. 430/175
4,614,701  9/1986  Mori et al. ..................... 430/175

FOREIGN PATENT DOCUMENTS 3207827   9/1982  Fed. Rep. of Germany .
59-10946  1/1984  Japan .
59-12432  1/1984  Japan .
2095854  10/1992 United Kingdom .

*Primary Examiner*—Charles L. Bowers, Jr.
*Assistant Examiner*—Christopher G. Young
*Attorney, Agent, or Firm*—Wenderoth, Lind & Ponack

[57] ABSTRACT

Disclosed is a photosensitive diazo resin for lithographic printing represented by the formula:

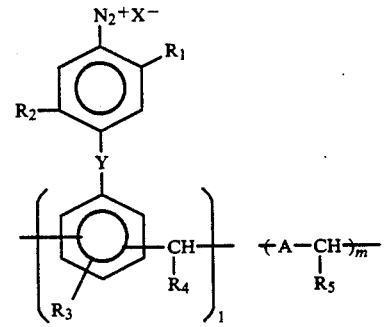

wherein $X^-$ is a counter anion, Y is a divalent bonding group selected from the group consisting of —NH—, —S— and —O—, $R_1$, $R_2$ and $R_3$ are groups which are independently selected from the group consisting of hydrogen, an alkyl group and an alkoxy group, $R_4$ and $R_5$ are groups which are independently selected from the group consisting of hydrogen, an alkyl group and a phenyl group, l and m are integers which satisfy the relation:

$$l+m=2 \text{ to } 100, \, l/m=30/70 \text{ to } 99/1$$

and A is a quaternary ammonium salt-containing group represented by the formula:

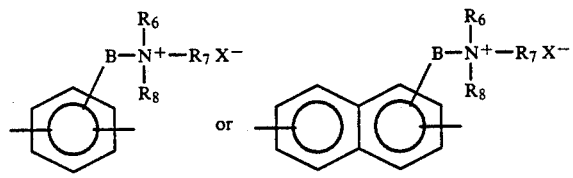

(wherein B is a straight or branched divalent $C_{1-10}$ alkyl group which bonds to an aromatic ring by a group selected from the group consisting of —CH$_2$—, —CO—, —O—, —S— and —N—, and $R_6$, $R_7$ and $R_8$ are groups which are independently selected from the group consisting of hydrogen and a $C_{1-20}$ alkyl group provided that at least two of $R_6$, $R_7$ and $R_8$ are alkyl groups). A photosensitive resin composition for lithographic printing comprising a diazo resin is also disclosed.

4 Claims, No Drawings

PHOTOSENSITIVE DIAZO RESINS AND RESIN COMPOSITIONS FOR LITHOGRAPHIC PRINTING HAVING A QUATERNARY AMMONIUM SALT-CONTAINING GROUP

FIELD OF THE INVENTION

The present invention relates to a photosensitive resin and a resin composition for lithographic printing. More particularly, it relates to a photosensitive diazo resin and a resin composition for a negative type printing material.

BACKGROUND OF THE INVENTION

In general, a photosensitive plate for lithographic printing consists of a photosensitive layer comprising a photosensitive compound and a solvent-soluble binder resin as main component which is coated onto a substrate such as an aluminum plate. Such printing plate is then exposed through a photoimage (e.g. negative, etc), and the non-exposed areas of the photosensitive layer is removed by eluting with a developer and the exposed insolublized area is remained as the image area of the lithographic printing plate.

Photosensitive plate for lithographic printing has been widely used in offset printing, because the time taken for plate-making process is short, and the operation is relatively simple. Accordingly, it is possible to provide a printing plate having excellent resolution, storage stability, developability and durability, and the demand for such cheap photosensitive plate or resin composition used in lithographic printing is extremely large.

The following properties are required for a photosensitive resin having excellent properties which is used for making a photosensitive plate or photosensitive resin composition for lithographic printing:
  (1) high sensitivity, that is, high absorptivity to active energy such that image can be formed even when the exposure amount is small;
  (2) stability, that is, the reactions (e.g. decomposition, crosslinking, etc.) will remain unchanged (even when it is stored for a long period of time at room temperature or under the conditions of high temperature and high humidity); and
  (3) solvent-solubility, that is, it has excellent solubility to a developer containing no harmful solvent (e.g. DMF, methyl cellosolve, etc.).

Diazo resin has widely been used as a photosensitive compound for lithographic printing plate because it satisfies the above properties, comparatively. Diazo resin is a resin containing a diazonium salt. At present, a diazo resin is obtained by polycondensation of p-diazodiphenyl amine and paraformaldehyde with an inorganic or organic counter anion is mainly used as a photosensitive resin for lithographic photosensitive plate.

In order to further improve printing properties, particularly sensitivity, stability and solvent-solubility of the diazo resin, various trials have been made heretofore.

As a trial for high sensitization of the diazo resin, for example, a diazonium compound of which main chain is polyester is described in Japanese Patent Kokai No. 54-30121. However, it is necessary to use a toxic compound (e.g. trifluoroacetic acid, etc.) as a solvent in order to prepare a diazo resin from a diazonium compound, and a reaction process at high temperature for a long period of time is also necessary. Accordingly, such a method is not suitable for practical use.

In Japanese Patent Kokai No. 58-062641, a method comprising synthesizing a prepolymer from acetylamino aniline and then diazotizing the prepolymer to prepare a diazo resin is described. Further, in Japanese Patent Kokai No. 58-187925, synthesis of a diazo resin according to the reaction of a diazonium compound with a vinyl ester compound is described. However, these methods are complicated because there are lot of synthesis processes, and are not suitable for practical use. Further, such diazo resin is inferior in solvent-solubility and, therefore, the resulting photosensitive plate is inferior in developability.

In Japanese Patent Kokai No. 61-273538, there is described a diazo resin obtained by esterifying a diazonium compound having a hydroxyl group to bond with a carboxylic acid-containing compound, followed by esterification with styrene-anhydrous maleic acid copolymer at room temperature for 3 hours. However, since sensitivity is not sufficiently improved, the resulting photosensitive plate is inferior in resolution.

In order to improve the stability of the diazo resin, a trial for improving the water-insolubility and lipophilic nature of the diazo resin has been made by coupling a water-soluble diazo resin with an inorganic compound. In Japanese Patent Kokai No. 47-1167, coupling of a water-soluble diazo resin with an acidic aromatic compound or coupling of a water-soluble diazo resin with a phenolic aromatic compound containing a hydroxyl group is described. However, since resins obtained by these methods are inferior in solubility to glycol, ether, alcohol and ketone, developability of a photosensitive plate becomes inferior. Further, a sulfonic acid or sulfonate containing a long chain alkyl group used herein is deposited in the gum-like form on synthesis and, therefore, it is hardly produced.

Further, a trial for using an organic solvent-soluble counter anion has also been made. In Japanese Patent Kokai No. 54-98613, halogenated Lewise acid (e.g. $BF_4$, $PF_6$, etc.) is used. In Japanese Patent Kokai No. 56-121031, perhalogen acid, perchloric acid and periodic acid are used. However, resins obtained by these methods are inferior in solvent-solubility. Accordingly, the developability of such photosensitive plate becomes inferior and the diazo resin is remained on the non-image area even after development and, therefore, scumming is arisen during printing.

In Japanese Patent Kokai No. 59-38746, a trial for using an organic coupling agent in combination with an inorganic coupling agent is described. However, a resin obtained by such method is remarkably inferior in solubility to an alkaline developer. Accordingly, a developability of a photosensitive plate becomes inferior and the diazo resin is remained on the non-image area even after development and, therefore, scumming is arisen during printing.

In Japanese Patent Kokai No. 62-175731, a combination of two sorts of an organic sulfonic acid of which numbers of a base unit is not less than 2.5 is described. In Japanese Patent Kokai No. 60-97350, the use of sulfopolyester as counter anion is described. According to these methods, stability of the resulting diazo resins is improved, however, reactivity of the diazo resin is lowered, which results in substantially insufficient resolution.

As a conventional trial for improving solvent-solubility of the diazo resin, for example, a co-condensation of an aromatic compound containing a phenolic hydroxyl group with an aromatic diazonium compound is described in Japanese Patent Kokai No. 1-102456. In Japanese Patent Kokai No. 1-102457, a co-condensation of an aromatic compound containing at least one sort of a carboxyl group and a hydroxyl group with an aromatic diazonium compound is described. Further, in Japanese Patent Kokai No. 1-245246, a co-condensation of an aromatic compound containing a sulfonic group, sulfinic group, and phenylene and naphthylene containing a salt thereof with an aromatic diazonium is described. However, when these resin compositions are used, the durability of the resulting printing plate becomes inferior.

OBJECTS OF THE INVENTION

The main object of the present invention is to provide a novel diazo resin for lithographic printing having excellent sensitivity and stability, of which range of dissolution to solvents is wide.

This object as well as other objects and advantages will become apparent to those skilled in the art from the following description.

SUMMARY OF THE INVENTION

That is, according to the present invention, there is provided a photosensitive diazo resin for lithographic printing represented by the formula:

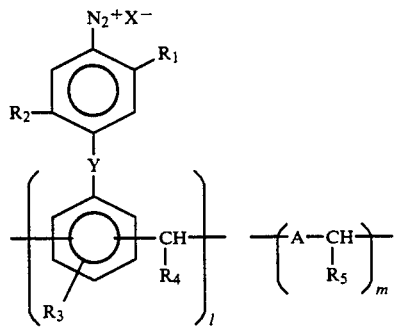

wherein $X^-$ is a counter anion, Y is a divalent bonding group selected from the group consisting of —NH—, —S— and —O—, $R_1$, $R_2$ and $R_3$ are groups which are independently selected from the group consisting of hydrogen, an alkyl group and an alkoxy group, $R_4$ and $R_5$ are groups which are independently selected from the group consisting of hydrogen, an alkyl group and a phenyl group, l and m are integers which satisfy the relation:

$l+m = 2$ to $100$, $l/m = 30$ to $99/1$ to $70$ and A is a quaternary ammonium salt-containing group represented by the formula:

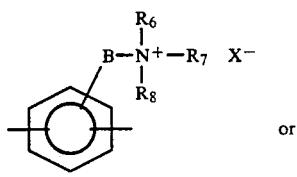

or

-continued

B—N⁺—R₇  X⁻ (with R₆, R₈ on naphthalene)

(wherein B is a straight or branched divalent $C_{1-10}$ alkyl group which bonds to an aromatic ring by a group selected from the group consisting of —CH₂—, —CO—, —O—, —S— and —N—, and $R_6$, $R_7$ and $R_8$ are groups which are independently selected from the group consisting of hydrogen and $C_{1-20}$ alkyl group provided that at least two of $R_6$, $R_7$ and $R_8$ are alkyl groups).

DETAILED DESCRIPTION OF THE INVENTION

The diazo resin in the present invention is that in which a quaternary ammonium salt is introduced into a resin skeleton. The diazo resin is obtained by polycondensating an aromatic diazonium compound with a quaternary ammonium salt-containing aromatic compound, using an active carbonyl compound, and/or at least one compound of the general formula:

$$R_9(-CH_2-OR_{10})_k$$

wherein k is an integer of 1 to 4, $R_9$ is a residue produced by the splitting off of hydrogen atoms from a diphenyl ether, diphenyl methane, piperazine, acyclic or aromatic compond, $R_{10}$ is an alkyl group with 1 to 4 carbon atoms, said condensation product containing, on the average, 0.25 to 0.75 unit derived from $R_9(-CH_2-OR_{10})_k$ per diazo group.

The aromatic diazonium compound used in the present invention is not specifically limited, and examples thereof include 4-diazo-4'-methoxydiphenylamine hexafluorophosphate, 4-diazo-4'-methoxydiphenylamine hydrogensulfate, 4-diazo-4'-ethoxydiphenylamine hexafluorophosphate, 4-diazo-4'-propoxydiphenylamine tetrafluoroborate, 4-diazo-3-methoxydiphenylamine hexafluoroborate, 4-diazo-3-diphenylamine tetrafluoroborate, 4-diazo-diphenylamine hexafluorophosphate, 4-diazodiphenylamine hydrogensulfate and the like. Particularly preferred aromatic diazonium compounds are 4-diazo-4'-methoxydiphenylamine salt, 4-diazo -4'-ethoxydiphenylamine salt, 4-diazo-3-methoxydiphenylamine salt, a salt of 4-diazo-diphenylamine with hydrogensulfate and the like.

As the quaternary ammonium salt-containing aromatic compound used in the diazo resin of the present invention, for example, there are N-methylanilinium trifluoroacetate, 2-phenacyl-2-thiopseudourea hydrochloride, benzyldimethylammonium hexafluoroarsenate, phenyltrimethylammonium bromide, phenyltrimethylammonium tribromide, phenyltrimethylammonium hexafluorophosphate, benzyldimethylammonium hexafluorophosphate, benzyltrimethylammonium tribromide, benzyltrimethylammonium chloride, benzyltrimethylammonium dichloroiodide, benzyltrimethylammonium hydrogendifluoride, phenyltrimethylammonium mesosulfate, (β-chlorocinnamylidene)-dimethylammonium perchlorate, benzoylcholine chloride, (2-benzoylethyl)trimethylammonium iodide, benzyltrimethylammonium methylcarbonate, benzyltriethylammonium tetrafluoroborate, benzyltriethylammonium chloride monohydrate, diethylmethyl(2-(3-methyl-2-phenylyaleryloxy)ethyl)ammonium bromide, diethylmethyl(2-(1-phenyl-2-propionyloxy)ethylthio)ethyl)ammonium methylsulfate, benzyltributylammonium bromide, benzyltributylammonium chloride, benzyltributylammonium iodide, (2-(2-butyloxy-1-phenylethylthio)-ethyl)diethylmethylammonium methylsulfate, benzyldimethyldodecylammonium bromide, domiphen bromide, (−)-N-dodecyl-N-methylephedrinium bromide, benzyldimethyltetradodecylammonium chloride dihydrate, benzyldimethyl(2-dodecyloxyethyl)ammonium chloride, benzyldimethyl(tetradodecylcarbamoylmethyl)ammonium chloride, benzyldimethylhexadecylammonium bromide, benzylbis(2-hydroxyethyl)(2-dodecyloxyethyl)ammonium bromide, benzylcetyldimethylammonium chloride monohydrate, benzylbis(2-hydroxyethyl)(2-dodecyloxyethyl)ammonium chloride, benzyldimethyl(hexadecylcarbamoylmethyl)ammonium chloride, benzyldimethylstearylammonium chloride monohydrate, benzyldimethylhexadecylammonium dichromate, benzalkonium chloride and the like.

Particularly, a quaternary ammonium salt-containing aromatic compound such as benzyltrimethylammonium chloride, phenyltrimethylammonium bromide, benzoylcholine chloride, benzyltriethylammonium chloride, benzyltributylammonium chloride, benzyldimethyldodecylammonium chloride, benzyldimethylhexadecylammonium chloride and the like is preferred.

Further, a tertiary amino group-containing compound which functions as a compound forming a quaternary ammonium salt-containing group may also be added to the reaction system. Examples of the tertiary amino group-containing organic compound include 1-methyl-1-phenyl-2-thiourea, N,N-dimethyl-N'-phenylformamidine, N,N-dimethylbenzylamine, N,N-dimethylbenzylamine-N-oxide, N-ethyl-N-phenylglycinonitrile, N-allyl-N-methylaniline, N-allyloxy-N-methylaniline, 2-(N-(2-bromoethyl)anilino)ethanol, N-(2-chloromethyl)-N-methylbenzylamine hydrochloride, 3-benzyl-1,1'-dimethyl-2-thiourea, (S)-(−)-N,N'-dimethyl-1-phenethylamine, (R)-(+)-N,N-dimethyl-1-phenethylamine, N-benzyl-N-methylethanolamine, 3-(N-methylanilino)-1-propanesulfonic acid, N,N-dimethylanilinechrominiumtricarbonyl, N-(2-cyanoethyl)-N-phenylglycine, N-methyl-N-propagylbenzylamine hydrochloride, N-methyl-N-propalgylbenzylamine, 3-dimethylamino-1-phenyl-2-propan-1-one, N-benzyliminodiacetic acid, 3-(N-ethylanilino)-propionitrile, N-allyl-N-methylbenzylamine, N,N-dimethyl-3-phenyl-2-propaneamine hydrochloride, 3-dimethylaminopropiophenone hydrochloride, N,N-dimethyl-L-phenylalanine, N-(2-chloroethyl)-N-ethylbenzylamine hydrochloride, N-(3-chloropropyl)-N-methylbenzylamine hydrochloride, 2-dimethylaminoethyl-N-phenylcarbamate, (1R,2S)-(−)-N-methylephedrine, (1S,2R)-(−)-N-methylephedrine, (1R,2R)-(+)-N-methylpseudoephedrine, (1S,2S)-(+)-N-methylpseudoephedrine, 3-(N-benzyl-N-methylamino)-1-propanol, (+)-3-(dimethylamino)-1-phenylpropanol, 3-(N-benzyl-N-methylamino)-1,2-propanediol, 2,2'-(benzylimino)-diethanol, N-methyl-1-phenyl-2,2'-iminodietanol, (1S,2S)-2-(dimethylamino)-1-phenyl-1,3-propanediol, 2,2'-(benzylimino)-diethanol-N-oxide, 2-(N-benzyl-N-ethylamino)-ethanethiol, N'-benzyl-N,N'-dimethylethylenediamine, N-benzyl-N,N'-dimethylethylenediamine, 3,3'-(phenylimino)dipropionitrile, N-benzyl-N-(2-chloroethyl)propagylamine hydrochloride, α-(2-dimethylaminoethyl)-benzylcyanide, 3-dimethylamino-2-methylpropiophenone hydrochloride, 3-dimethylamino-2-metylpropiophenone, 2-(N-ethylanilino)-ethylacetate, 1-dimethylamino-2-propylbenzoate hydrochloride, 2-chloro-N,1'-dimethyl-2'-phenoxydiethylamine hydrochloride, N-(2-chloroethyl)-N-(2-methoxyethyl)-benzylamine hydrochloride, N,N-di-N-propylaniline, diethyl(1-phenylethyl)aminepicrate, 2-(diethylamino)-1-phenyletanol, β-(phenoxy)triethylamine, β-(2-dimethylaminoethylthio)-phenethylalcohol, 1-(3-dimethylamino)-propyl)-3-phenylurea, 3-(N-butylanilino)-propionitrile, 2-(dimethylaminoethyl)-butylophenone hydrochloride, N-benzyl-N-(2-dimethylaminoethyl)-acetoamide, 2-(dietylamino)ethyl-N-phenylcarbamate, 2-(diethylamino)ethyl-N-phenylcarbamate hydrochloride, N-benzyl-N-(trimethylsilylmethyl)aminoacetonitrile, α-((diethylamino)methyl)-phenethylalcohol, 1-(diethylamino)-3-(phenylthio)-2-propanol, N'-benzyl-N,N-diethylethylenediamine, 1-(2-(N-ethylanilino)-ethylamino)-isopropylphosphinic acid, 3-(N-ethyl-N-methylamino)-N-(2-phenoxyethyl)-propionamide, β-(2-(diethylamino)-ethylthio)phenethylalcohol, α-(2-(diethylamino)-ethylthiomethyl)-benzylalcohol, 2-(2-(diethylamino)ethylthio)-1-phenylethanol, 2-(2-(diethylamino)ethoxy)-1-phenylethanol, N,N-bis-(2-ethylthio)ethylaniline, N'-benzyl-N,N'-diethyl-1,3-propanediamine, 2,2,2-trichloroethyl-3-(N-(2-propinyl)-benzylamino)-propionate, N-benzyl-N-(3-cyanopropyl)-glycineethyl ester, dimethyl-3,3'-(benzylimino)dipropionate, 2-(2 (dimethylamino)ethyl)-2-(2-(methylthio)ethyl)-2-phenylacetonitrile, 4-dimethylamino-2-(2-(methylthio)ethyl) 2 phenylbutylonitrile hydrochloride, 2-diethylamino -N-(α-methylphenethyl)acetoamide, N-benzyl-3-(N-butyl-N -methylamino)-propionamide, 2-(3-(diethylamino)propylthio)-1-phenylethanol, 2-(diethylamino)-ethyl-2-phenylbutylate citrate, ethyl-α-(2-(diethylamino)-ethylthio)-phenylacetate citrate, 2-diethylamino-N-methyl-N-(α-methylphenethyl)acetamide, N,N-bis(2-carbetoxyethyl)benzylamine, N-(2-carbetoxyethyl)-N-(2-carbetoxypropyl)benzylamine, N-octyl-N -(3-sulfopropyl)aniline, diethyl-3,3'-(phenethylimino)dipropionate, 2-(2-(diethylamino)-ethyl)-3-methyl-2-phenylvaleronitrile, 2-(diethylamino)-ethyl-2-phenylhexanoate hydrochloride, 1-(3-(dibutylamino)propyl)-3-phenyl-2-thiourea, 2-diethylamino-N-methyl-N-(2-methyl-1-phenylbutyl)-acetamide hydrochloride, 3-(diethylamino)propyl-3-methyl-2-phenylvalerate hydrochloride, 2-diethylamino-N-methyl-N-(3-methyl-2-phenylpentyl)-acetamide hydrochloride, diethyl(2-(N-benzyl-N-methyamino)-ethyl)(2-(methylthio)-ethyl)-malonate hydrochloride, 2-(2-diethylaminoethoxy)-ethyl-2-ethyl-2-phenylbutyrate citrate, N-ethyl-N-phenyldodecylamine, N-phenylhexadecylamine, ethyl-4-((N-dodecyl)anilino)butyrate, N-hexadecyl-N-methylthiobenzamide, N-(2-(N-hexadecylanilino)-ethyl)-methanesulfonamide, dimethylaminonaphthalene and the like.

Particularly, a tertiary amino group-containing organic compound such as N,N-dimethylbenzylamine, N-benzyl-N-methylethanolamine, N-benzyliminodiacetic acid, N-aryl-N-methylbenzylamine, 2,2'-benzyliminodiethanol, N-diethylamino-1-phenylethanol, β-phenoxytriethylamine, 1-diethylamino 3-phenylthio 2-propanol and the like is preferred.

As the active carbonyl compound which is used as the crosslinking agent for polycondensation reaction in the present invention, for example, there are aldehydes (e.g. paraformaldehyde, formaldehyde, acetoaldehyde, butylaldehyde, benzaldehyde, etc.), ketones (e.g. acetone, acetophenone, etc.), vinyl compounds, vinyl ester compounds, vinyl ether compounds and sulfur derivatives thereof.

The reaction for preparing the diazo resin of the present invention is well known in the art. For example, it may be conducted according to a method described in Photo. Sci. Eng., Vol. 17, pages 33 (1973), or a method described in British Patent No. 1312725.

In that case, an aromatic diazonium compound, a quaternary ammonium salt-containing aromatic compound and an active carbonyl compound are subjected to a polycondensation reaction in sulfuric acid, phosphoric acid, hydrochloric acid or methanesulfonic acid at 5° to 70° C. for 30 minutes to 72 hours under a normal pressure to obtain a diazo resin.

The ratio of the aromatic diazonium compound to the quaternary ammonium salt-containing aromatic compound is 30 to 99/1 to 70, preferably 50 to 95/5 to 50.

The molecular weight of the resulting diazo resin can be adjusted by changing the ratio of the total molar number of the aromatic diazonium compound and the quaternary ammonium salt-containing aromatic compound to that of the active carbonyl compound to be added, a reaction temperature and a reaction time. Normally, the ratio of the aromatic diazonium compound and the quaternary ammonium salt-containing aromatic compound to the active carbonyl compound is 0.6 to 1.5/1, preferably 0.7 to 1.4/1. A weight-average molecular weight of the diazo resin thus obtained is 400 to 50,000, preferably 600 to 20,000, more preferably 800 to 4,500.

The diazonium group in the diazo resin of the present invention can optionally take the salt form by exchanging with various counter anions. The exchange reaction can be conducted by adding the counter anion to the diazo resin. The diazonium group may be converted into a double salt of a hydrogen sulfate with a zinc chloride, or it may be converted into a salt by exchanging with the other anion. When a water-soluble diazo resin is required, it is preferably to converted into a double salt, hydrogen sulfate, methanesulfonate or phosphate. The amount of the counter anion varies depending upon a kind of the counter anion and an equivalent of the diazo group of the diazo resin. Generally, the molar ratio of the diazo group to the counter anion group is preferably 100/50 to 120, more preferably 100/70 to 110. As the counter anion, for example, organic acid or salt thereof, inorganic acid, other compounds and the like may be used.

Examples of the organic acid or salt thereof which can be used as the counter anion include an organic acid or salt thereof containing a skeleton described in the following item (i) or an acid group described in the following item (ii):

(i) aromatic skeltons (e.g. benzene, toluene, naphthalene, etc.) and aliphatic skeltones (e.g. polymer described in Japanese Patent No. 5700542, sulfonated polymer, etc.);

(ii) acid groups (e.g. carboxylic acid, decanoic acid, phophonic acid, phosphinic acid, phenylphospholic acid, sulfonic acid, etc.).

Examples thereof include paratoluenesulfonic acid, mesitylenesulfonic acid, naphthalenesulfonic acid, dodecylbenzenesulfonic acid and a salt thereof.

As the inorganic acid used as the counter anion, for example, there are halogenated Lewise acid (e.g. $PF_6$, $BF_4$, etc.), perhalogen acid (e.g. $ClO_4$, $IO_4$, etc.) and the like.

Further, a hydroxyl group-containing aromatic compound (e.g. phenolic acid, etc.) and a polymer containing a carboxyl group or an anhydride group may also be used as the counter anion.

Examples of the preferred counter anion include p-toluenesulfonic acid, mesitylenesulfonic acid, dodecylbenzenesulfonic acid, 2-methoxy-4-hydroxybenzophenone-5-sulfonic acid, $PF_6$, $BF_4$, $Sb_6$ and the like.

The diazo resin of the present invention per se can be polymerized by subjecting to a polymerization reaction upon irradiation, which results in formation of an image. However, from a viewpoint of cost, physical properties of film, workability, etc., it is preferred to use the diazo resin as a photosensitive resin composition in combination with a binder resin having excellent solvent-developability, which forms a matrix of a printing plate. For example, by using the diazo resin of the present invention in combination with a water-soluble resin (e.g. PVA, etc.), a water-developable photosensitive composition is prepared.

Such a binder resin may have a reactivity with the diazo resin of the present invention. As the binder resin used in the photosensitive resin composition, for example, there are acrylic resin, polyester resin, alkyd resin, phenol resin, epoxy resin, polyvinyl resin, polyurethane resin, polyether resin, polyamide resin and a modified resin thereof. The resin having a dissolution and disperson property to water or alkali solution is preferred, and an alkali solution-soluble acrylic resin and phenol resin are particularly preferred. At least two sorts of binder resins may be used in combination.

As the preferred alkali solution-soluble acrylic resin, for example, there is an acrylic resin having an acid value of 10 to 150, a hydroxyl group value of 1 to 250 and a molecular weight of 2,000 to 500,000, more preferably an acrylic resin having an acid value of 10 to 40, a hydroxyl group value of 40 to 200 and a molecular weight of 5,000 to 40,000. The resin per se may have photosensitivity.

The acrylic resins is an acrylic polymers which is normally used in a paint industry. Further, the acrylic resin is obtained by polymerizing an ester monomer of acrylic acid or methacrylic acid alone, or copolymerizing the ester monomer with the other ethylenically unsaturated monomer. Such a polymerization operation is conducted by a method well known in the art. In Japanese Patent Application No. 3-20919, there are described a polymerization initiator, a solvent and reaction conditions which can be used for polymerization.

Monomers which can be used for preparing a preferred acrylic resin are as follows:

(I) acidic group-containing monomers (e.g. acrylic acid, methacrylic acid, crotonic acid, itaconic acid, maleic acid, anhydrous maleic acid, fumaric acid, sodium vinylsulfonate, styrene-p-sodium sulfonate, 2-acrylamide-2-methylpropanesulfonic acid, 2-amidephosphoxyethyl methacrylate, etc.);

(II) hydroxyl group-containing monomers (e.g. 2-hydroxyethyl acrylate, hydroxypropyl acrylate, 2-hydroxyethyl methacrylate, hydroxypropyl methacrylate, hydroxybutyl acrylate, hydroxybutyl methacrylate, allyl alcohol, metaallyl alcohol, N-(4-hydroxyphenyl)acrylamide or N-(4 hydroxyphenyl)methacrylamide, o-, m- or p-hydroxystyrene, o-, m- or p-hydroxyphenyl acrylate or methacrylate, etc.;

(III) alkyl acrylates or methacrylates (e.g. methyl (meth)acrylate, ethyl (meth)acrylate, n-butyl (meth)acrylate, propyl (meth)acrylate, acyl (meth)acrylate, cyclohexyl (meth)acrylate, octyl acrylate, 2-chloroethyl acrylate, etc.;

(IV) polymerizable amides such as acrylamides or methacrylamides (e.g. acrylamide, methacrylamide, N-methylolacrylamide, N-methylolmethacrylamide, N-ethylacrylamide, N-hexylacrylamide, N-cyclohexylacrylamide, N-hydroxyethylacrylamide, N-phenylacrylamide, N-nitrophenylacrylamide, N-ethyl-N-phenylacrylamide, etc.);

(V) nitrogen-containing alkyl acrylates or methacrylates (e.g. dimethylaminoethyl acrylate, dimethylaminoethyl methacrylate, etc.);

(VI) vinyl ethers (e.g. ethyl vinyl ether, 2-chloroethyl vinyl ether, hydroxyethyl vinyl ether, propyl vinyl ether, butyl vinyl ether, octyl vinyl ether, phenyl vinyl ether, etc.;

(VII) vinyl esters (e.g. vinyl acetate, vinyl chloroacetate, vinyl butyrate, vinyl benzoate, etc.);

(VIII) styrenes (e.g. styrene, $a$-styrene, methylstyrene, chloromethylstyrene, etc.);

(XI) vinyl ketones (e.g. methyl vinyl ketone, ethyl vinyl ketone, propyl vinyl ketone, phenyl vinyl ketone, etc.);

(X) olefins (e.g. ethylene, propylene, isobutylene, butadiene, isoprene, etcc.);

(XI) glycidyl (meth)acrylates;

(XII) polymerizable nitriles (e.g. acrylonitrile, methacrylonitrile, etc.);

(XIII) N-vinylpyrrolidone, N-vinylcarbazole, 4-vinylpyridine;

(XIV) ampho-ionic monomers (N,N-dimethyl-N-methacryloxyethyl-N-(3-sulfopropyl)-ammonium-betain, N,N-dimethyl-N-methacrylamidepropyl-N-(3-sulfopropyl)-ammonium betain, 1-(3-sulfopropyl)-2-vinylpyridinium-betain, etc.; and (XV) compounds obtained by reacting the above monomers with compounds having a functional group which is chemically reactive with the monomers (e.g. reaction produced monomer of a hydroxyl group-containing monomer (II) with an isocyanate compound, reaction produced monomer of a carboxyl group-containing monomer (I) with a glycidyl group-containing compound, etc.).

In the present invention, examples of the other preferred binder resin which is formulated together with the diazo resin include an alkali-soluble novolak resin. Examples thereof include phenol-formaldehyde resin, cresol-formaldehyde resin, p-t-butyl phenol-formaldehyde resin, phenol-modified xylene resin, phenol-modified xylene mesitylene resin and the like. Examples of the other useful alkali-soluble resin include copolymers of polyhydroxystyrene, polyhalogenated hydroxystyrene and (meth)acrylic acid with the other vinyl compounds (e.g. methyl methacrylate, etc.). Further, if necessary, polyvinyl butyral resin, poluurethane resin, polyamide resin, polystyrene-maleic acid resin, epoxy resin, natural resin and modified resin or water-solubilized modified resin thereof may be used.

The photosensitive composition of the present invention is prepared by formulating a diazo resin in an amount of 5 to 30 parts by weight, preferably 6 to 20 parts by weight based on 100 parts by weight of the binder resin. When the amount of the diazo resin is smaller than 5 parts by weight, resolution of the resulting photosensitive plate and durability of the printing plate are lowered. When the amount of the diazo resin exceeds 30 parts by weight, sensitivity of the photosensitive composition and developability of the photosensitive plate are lowered.

The photosensitive resin composition of the present invention further contains image colorants such as dyes pigments and the like. The image colorant is formulated so as to improve image distinguishability and handling characteristic of the printing plate, and a basic dye and an oil-soluble dye are preferred. Examples thereof include basic dyes such as Victoria Pure Blue BOH, Victoria Blue BH, Methyl Violet, Aizen Malachite Green (hereinabove, manufactured by Hodagaya Chemical K.K.), Patent Pure Blue VX, Rhodamine B, Methylene Blue (hereinabove, manufactured by Sumitomo Chemical Industries K.K.), etc. and oil-soluble dyes such as Sudan Blue II, Victoria Blue F4R (hereinabove, manufactured by B.A.S.F.), Oil Blue #603, Oil Blue BOS, Oil Blue IIN (hereinabove, manufactured by Orient Chemical Industries K.K.), etc.

The colarant is contained in the photosensitive composition of the present invention in an amount of 0.1 to 5 parts by weight, preferably 0.2 to 4 parts by weight based on 100 parts by weight of the binder resin. When the amount of the colorant is smaller than 0.1 parts by weight, visibility of the image area is not obtained. When the amount of the colorant exceeds 5 parts by weight, sensitivity of the photosensitive composition of the present invention is lowered and, therefore, resolution of the resulting photosensitive plate is lowered.

The photosensitive resin composition of the present invention may further contain additives, if necessary, such as solvents, fillers, pigments, photo-degradatable acid generators, surfactants for improving application property, anti-foaming agents and organic or inorganic fillers. As the organic filler, for example, microgel (particle size of 0.01 to 5 $\mu$m) of which inside is gelatinized is preferred, and examples thereof are disclosed in Japanese Patent Application No. 3-36029.

By using the photosensitive resin composition of the present invention, a photosensitive plate for lithographic printing is made by a normal method. For example, the photosensitive resin composition of the present invention may be coated on a suitable substrate. Examples of the substrate include paper, paper on which a plastic (e.g. polyethylene, polypropylene, polystyrene, etc.) is laminated, aluminum (containing aluminum alloy), plate of metals (e.g. zinc, copper, etc.), plastic film (e.g. cellulose diacetate, cellulose triacetate, cellulose propionate, cellulose acetate, cellulose methyl acetate, cellulose ethyl acetate, cellulose nitrate, polyethylene terephthalate, polyethylene, polystyrene, polypropylene, polycarbonate, polyvinyl acetal, etc.), paper or plastic film on which the above metal is laminated or deposited and the like. Among these substrates, an aluminum plate has excellent dimensional stability and is comparatively lightweight and inexpensive, and it is preferred. A composite sheet wherein an aluminum sheet is bound to a polyethylene terephthalate film as described in Japanese Patent Kokoku No. 48-18327 is also preferred.

It is preferred that the substrate having the surface of metal, particularly aluminum is subjected to a hydrophilization treatment.

The method of coating is not specifically limited, for example, coating is conducted using a bar coater, followed by drying at 40° to 80° C. for 1 to 10 minutes. The amount of coating after drying is about 0.5 to 2.5 g/m$^2$.

If necessary, the resin which is soluble in an alkali developer (e.g. polyvinyl alcohol, hydroxylpropyl methylcellulose, etc.) can be further coated, followed by drying to provide an overcoat layer.

The dried coat thus obtained is covered with a negative or positive film, exposed to light and then developed according to a normal method to obtain a lithographic printing plate. As the light source used for exposure, for example, there are carbon-arc lamp, mercury vapour lamp, xenon lamp, metal halide lamp, tangusten light, ultraviolet rays, ultraviolet-laser rays, visible-laser rays and the like. It is preferred that developing is conducted using an alkali developer. As the alkalinizing agent formulated in the alkali developer, for example, there are inorganic alkalinizing agents (e.g. sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, ammonia, etc.) and organic amine compounds (e.g. monomethylamine, dimethylamine, trimethylamine, monoethylamine, diethylamine, triethylamine, monoisopropylamine, n-butylamines, monoethanolamine, diethanolamine, triethanolamine, monoisopropanolamine, diisopropanolamine, triisopropanolamine, ethyleneimine, ethylenediamine, pyridine, etc.) As the solvent for the alkalinizing agent, for example, there can be used water (particularly, deionized water) and the like. If necessary, benzyl alcohol, phenyl cellosolve, ethyl cellosolve and the like are further used. The concentration of the alkalinizing agent may be appropriately selected.

The dizao resin of the present invention has remarkably high sensitivity and crosslinkability with the binder resin formulated and the mechanism related to such high reactivity of the present diazo resin is not known for certain, but it is considered that a quaternary ammonium group acts as amine and attributes to decomposition of a diazo group and reaction of a generated radical, whereby, crosslinkability of the diazo resin with the binder resin is remarkably enhanced. Further, it is considered that the diazo resin containing a salt comprising the quaternary ammonium group and a counter cation in a skeletone of the present invention has a surplus counter anion and, therefore, stability of the resin is increased.

The effect of the quaternary ammonium base is not sufficiently obtained by merely adding a quaternaly ammonium group-containing compound to a conventional diazo resin and no remarkable effect can be obtained without introducing the quaternaly ammonium group in the skeleton of the diazo resin.

As described above, by introducing a quaternary ammonium group into a skeleton of a diazo resin, a novel diazo resin for lithographic printing having excellent sensitivity and stability, of which range of dissolution to organic solvento is wide. Thereby, a printing plate having excellent resolution, storage stability, developability and durability can be provided and, at the same time, a photosensitive plate and a photosensitive resin composition for lithographic printing wherein the amount of an aromatic diazonium compound to be used is reduced can be provided.

The following Examples and Comparative Examples further illustrate the present invention in detail but are not to be construed to limit the scope thereof. In the Examples and Comparative Examples, all "parts" are by weight unless otherwise stated.

In Examples 1 to 6, preparation of a diazo resin will be explained.

EXAMPLE 1

4-Diazo-diphenylamine sulfate (16.6 parts, 0.057 moles) and benzyltrimethylammonium chloride (8.1 parts, 0.043 moles) were dissolved in concentrated sulfuric acid (100 parts) under ice cooling. To the reaction solution was slowly added paraformaldehyde (3 parts, 0.1 moles) and the reaction temperature was maintained at 10° C. or less.

After the reaction was conducted for 2 hours, the reaction mixture was poured into ethanol (1 liter) under ice cooling and the precipitate formed was filtered off. The precipitate was completely washed with ethanol and dissolved in deionized water (200 ml). By adding an aqueous solution containing zinc chloride (13.6 parts) to the resulting aqueous solution, a precipitate was formed. The precipitate was filtered off, washed with ethanol and dried to obtain a diazo resin 1. The resulting diazo resin 1 was dissolved again in deionized water (200 ml), and to the aqueous solution was added an aqueous solution containing sodium hexafluorophosphate (16.8 parts) to conduct the anion exchange reaction. The resulting precipitate was filtered off, washed with deionized water and dried at room temperature for 24 hours to obtain a diazo resin 2. The molecular weight of the diazo resin was measured by GPC. As a result, the weight-average molecular weight was 2400. The organic solvent-solubility of the diazo resin 2 was evaluated. As a result, it was completely dissolved in DMF, methyl cellosolve and methoxypropanol.

EXAMPLE 2

According to the same manner as that described in Example 1 except that 4-diazo-4'-methoxyphenylamine sulfate (18.5 parts, 0.057 moles) was used in place of 4-diazo-diphenylamine sulfate, benzoylcholine chloride (10.5 parts. 0.043 moles) was used in place of benzyltrimethylammonium chloride, paraformaldehide (2.7 parts, 0.09 moles) was used and paratoluenesulfonic acid was used in place of sodium hexafluorophospahte, a dizao resin 3 was obtained. The weight-average molecular weight of the diazo resin 3 was 1800. The organic solvent-solubility of the diazo resin 3 was evaluated. As a result, it was completely dissolved in DMF, methyl cellosolve and methoxypropanol.

EXAMPLE 3

According to the same manner as that described in Example 1 except that 4-diazo-4'-diphenylamine sulfate (23.3 parts, 0.08 moles) was used, domiphen bromide (8.0 parts, 0.02 moles) was used in place of benzyltrimethylammonium chloride, acetoaldehide (4.4 parts, 0.1 moles) was used in place of paraformaldehide and 2-methoxy-4-hydroxy-5-benzoylbenzenesulfonic acid was used in place of sodium hexafluorophosphate, a dizao resin 4 was obtained. The weight-average molecular weight of the diazo resin 4 was 3600. The organic solvent-solubility of the diazo resin 4 was evaluated. As a result, it was completely dissolved in DMF, methyl cellosolve and methoxypropanol.

EXAMPLE 4

According to the same manner as that described in Example 1 except that phenyltrimethylammonium bromide (9.3 parts, 0.043 moles) was used in place of benzyltrimethhylammonium chloride and potassium hexafluorophosphate was used in place of sodium hexafluorophosphate, a diazo resin 5 was obtained. The weight-average molecular weight of the diazo resin 5 was 2700. The organic solvent-solubility of the diazo resin 5 was evaluated. As a result, it was completely dissolved in DMF, methyl cellosolve and methoxypropanol.

EXAMPLE 5

According to the same manner as that described in Example 1 except that benzyltributylammonium bromide (15.3 parts, 0.043 moles) was used in place of benzyltrimethylammonium chlorideammonium chloride, a dizao resin 6 was obtained. The weight-average molecular weight of the diazo resin 6 was 2400. The organic solvent-solubility of the diazo resin 6 was evaluated. As a result, it was completely dissolved in DMF, methyl cellosolve and methoxypropanol.

EXAMPLE 6

According to the same manner as that described in Example 1 except that β-(phenoxy)-triethylamine (8.3 parts, 0.043 moles) was used in place of benzyltrimethylammonium chloride, a dizao resin 7 was obtained. The weight-average molecular weight of the diazo resin 7 was 3100. The organic solvent-solubility of the diazo resin 7 was evaluated. As a result, it was completely dissolved in-DMF, methyl cellosolve and methoxypropanol.

COMPARATIVE EXAMPLE 1

According to the same manner as that described in Example 1 except that 4-diazo-diphenylamine sulfate (29.1 parts, 0.1 moles) was used in place of benzyltrimethylammonium chloride, a dizao resin 8 was obtained. The weight-average molecular weight of the diazo resin 8 was 2400. The organic solvent-solubility of the diazo resin 8 was evaluated. As a result, it was dissolved in DMF but was not dissolved in methyl cellosolve and methoxypropanol.

In Examples 7 to 9, preparation of a printing plate using the diazo resin of the present invention will be explained.

EXAMPLE 7

By using the diazo resin prepared in Example 1, a photosensitive composition of a formulation shown in Table 1 was prepared.

TABLE 1

| Component | (Formulation) Amount (parts) |
|---|---|
| Polyvinyl alcohol[1] | 8.8 |
| Diazo resin 1 | 1.2 |
| Deionized water | 100 |

[1]Polyvinyl alcohol having a molecular weight of 20,0000, a part of which is modified with sulfonic acid A photosensitive composition obtained by sufficiently mixing was coated on a roughened aluminum plate such that the coating weight became 4 g/m² after dring at 70° C. for 10 minutes to obtain a negative type photosensitive plate for lithographic printing. Then, this photosensitive plate was exposed with a high pressure mercury vapour lamp through a negative film and developed with deionized water to obtain a printing plate.

EXAMPLE 8

By using the diazo resin 2 prepared in Example 1, a photosensitive composition of a formulation shown in Table 2 was prepared.

TABLE 2

| Component | (Formulation) Amount (parts) |
|---|---|
| Alkali-soluble acrylic resin 1[1] | 9.2 |
| Diazo resin prepared in Example 1 | 0.8 |
| Victoria Pure Blue BOH | 0.25 |
| Methoxypropanol | 40.00 |
| Dimethylformamide | 49.75 |

[1]Acrylic resin having a molecular weight of 25,0000 prepared using 100 parts of 2-hydroxyethyl methacrylates, 40 parts of acrylonitrile, 53 parts of isobutyl methacrylate and 7 parts of methacrylic acid The resulting photosensitive composition solution was charged in a container and allowed to stand for 3 days. As a result, no sedimentation and separation was observed and it showed excellent stability. Further, the photosensitive composition solution was coated on an aluminum plate which had been roughened and subjected to a hydrophilization treatment by a bar coater and then dried at 80° C. for 4 minutes to obtain a negative PS plate having the coating weight of 2 g/m². The application property of the composition was excellent and the composition can be uniformly coated. No paint defect such as seediness, dewetting and the like was observed.

Then, the photosensitive plate was exposed with a vacuum printer HVP-22H manufactured by Sakaguchi Seiwa Kogyo K.K. (3 kW idlefin metal halide lamp manufactured by Eye graphics K.K.) through the negative film at a distance of 1.2 m for 1 minutes and 30 seconds. Then, the exposed plate was developed with a diluted solution (developer for negative plate of automatic process/water=1:1) at a developing rate of 80 cm/min and coated with a gumming solution to obtain a lithographic printing plate.

The non-developed part was not observed in the resulting printing plate. The number of steps was 3 to 11 and it showed excellent reproductivity.

Thereafter, durability and printing properties of the printing plate were evaluated. For the surface of the printing plate taken out from an automatic developing device, a rubbing test (100 times) was conducted using an absorbing wadding impregnated with water. As a result, no abrasion wear of the printing area and exposure of the substrate part due to abrasion wear was observed in the printing plate of the present invention even after rubbing, and it showed sufficient image area resistance.

Then, the printing plate was mounted on a small lithographic printer Hamadaster 700CDX (manufactured by Hamada Insatsuki Seisakusho K.K.) and a high quality paper was printed using a commercially available ink. As a result, 150,000 sheets of paper were satisfactorily printed without scumming the non-image area. Particularly, reproductivity of the halftone was excellent.

COMPARATIVE EXAMPLE 2

According to the same manner as that described in Example 8 except that the diazo resin 8 prepared in Comparative Example 1 in place of the diazo resin 2, a lithographic printing plate was obtained. For the resulting printing plate, a similar absorbing wadding rubbing test was conducted. Abrasion wear and exposure of the substrate were observed in the part of the printing area after rubbing. In a printing test, the same results were obtained when 100,000 sheets of paper were printed. However, when 150,00 sheets of paper were printed, deterioration of reproductivity of the halftone was observed.

COMPARATIVE EXAMPLE 3

According to the same manner as that described in Example 8 except that 0.44 parts of the diazo resin 2 and 0.36 parts of benzyltrimethylammonium hexafluorophosphate were used in place of the diazo resin 2, a lithographic printing plate was obtained.

For the resulting printing plate, a similar absorbing wadding rubbing test was conducted. Abrasion wear and exposure of the substrate were observed in the part of the image area after rubbing. In a printing test, productivity of the halftone was inferior in comparison with Example 8 when 100,000 sheets of paper were printed. This fact showed that the same effect as that of the diazo resin of the present invention can not be obtained by merely adding a quaternary ammonium salt-containing compound.

EXAMPLE 9

By using an alkaline-soluble acrylic resin 2 having an acid value of 54.6, a hydroxyl group vale of 199 and a molecular weight of 22,000 of a formulation shown in Table 3 and the diazo resin 6 obtained in Example 5, a photosensitive composition of a formulation shown in Table 4 was prepared.

TABLE 3

| Components | (Formulation) Amount (parts) |
| --- | --- |
| 2-Hydroxypropyl methacrylate | 46 |
| Acrylonitrile | 15 |
| Isobutyl methacrylate | 28.9 |
| SPE[1)] | 2.5 |
| Methacrylic acid | 7.6 |

[1)]N,N-dimethyl-N-methacrylamidepropyl-N-(3-sulfopropyl)ammonium betain, Mn = 292

TABLE 4

| Components | Amount (parts) |
| --- | --- |
| Alkali-soluble acrylic resin 2 | 8.7 |
| Microgel[1)] | 0.46 |
| Diazo resin 6 | 0.8 |
| Victoria Pure Blue BOH | 0.25 |
| Methoxypropanol | 69.75 |
| Isopropanol | 20 |

[1)]Microgel having a particle size of 0.24 μm obtained by mixing polymer emulsifier-/ethylene glycol dimethacrylate/methyl methacrylate/n-butyl acrylate in a ratio of 10/30/10/45 and subjecting the mixture to an emulsion polymerization According to the same manner as that described in Example 8 except that the resulting resin was used in place of the diazo resin 2, a photosensitive plate and a lithographic printing plate were obtained. For the printing plate obtained after developing, a similar durability test and print properties test were conducted. As a result, the printing plate showed the same property as that of the printing plate of Example 8.

What is claimed is:

1. A photosensitive diazo resin for lithographic printing represented by the formula:

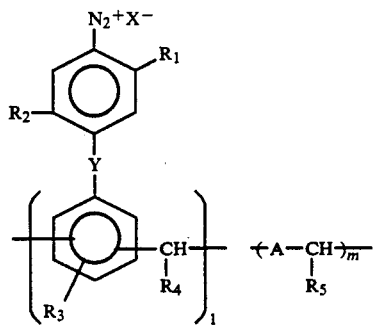

wherein $X^-$ is a counter anion, Y is a divalent bonding group selected from the group consisting of —NH—, —S— and —O—, $R_1$, $R_2$ and $R_3$ are groups which are independently selected from the group consisting of hydrogen, an alkyl group and an alkoxy group, $R_4$ and $R_5$ are groups which are independently selected from the group consisting of hydrogen, an alkyl group and a phenyl group, l and m are integers which satisfy the relation:

$l+m=2$ to 100, $l/m=30$ to $99/1$ to 70 and A is a quaternary ammonium salt-containing group represented by the formula:

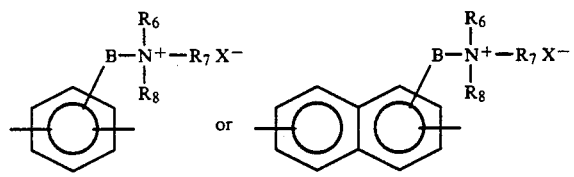

wherein B is a straight or branched divalent $C_{1-10}$ alkyl group which bonds to an aromatic ring by a group selected from the group consisting of —CH$_2$—, —CO—, —O—, —S— and —N—, and $R_6$, $R_7$ and $R_8$ are groups which are independently selected from the group consisting of hydrogen and a $C_{1-20}$ alkyl group provided that at least two of $R_6$, $R_7$ and $R_8$ are alkyl groups.

2. A photosensitive resin composition for lithographic printing comprising a diazo resin according to claim 1.

3. The photosensitive resin composition for lithographic printing according to claim 2 which further comprises a binder resin.

4. The photosensitive resin composition for lithographic printing according to claim 2 which further comprises an image colorant.

* * * * *